United States Patent [19]

Maeda

[11] Patent Number: 4,663,825

[45] Date of Patent: May 12, 1987

[54] METHOD OF MANUFACTURING SEMICONDUCTOR DEVICE

[75] Inventor: Takeo Maeda, Tokyo, Japan

[73] Assignee: Kabushiki Kaisha Toshiba, Kawasaki, Japan

[21] Appl. No.: 780,071

[22] Filed: Sep. 25, 1985

[30] Foreign Application Priority Data

Sep. 27, 1984 [JP] Japan .............................. 59-202709
Sep. 27, 1984 [JP] Japan .............................. 59-202710
Nov. 30, 1984 [JP] Japan .............................. 59-253007

[51] Int. Cl.[4] ........................................ H01L 21/265
[52] U.S. Cl. .................................... 29/571; 29/576 B; 29/578; 29/591; 148/1.5; 148/175; 148/188; 148/DIG. 140; 357/65
[58] Field of Search .................... 29/571, 576 B, 578, 29/591; 148/1.5, 175, 187, 188; 357/65

[56] References Cited

U.S. PATENT DOCUMENTS

| 4,450,620 | 5/1984 | Fuls et al. ............................. | 29/571 |
| 4,457,972 | 7/1984 | Griffith et al. ....................... | 148/1.5 |
| 4,502,206 | 3/1985 | Schnable et al. ................. | 29/576 B |
| 4,502,207 | 3/1985 | Ohshima et al. ................. | 29/576 B |
| 4,526,624 | 7/1985 | Tombrello et al. ................. | 148/1.5 |

OTHER PUBLICATIONS

Tsaur et al., in Interfaces & Contacts, Ed. Ludeke et al., North Holland, 1982, N.Y. p. 385.
Tombrello, Nucl. Instr. & Methods, 218 (1983) p. 679.

*Primary Examiner*—Upendra Roy
*Attorney, Agent, or Firm*—Finnegan, Henderson, Farabow, Garrett & Dunner

[57] ABSTRACT

A method of manufacturing a semiconductor device comprises the steps of forming a gate electrode on a silicon substrate of a p-conductivity type and source and in the drain regions of an n-conductivity type substrate so as to interpose the gate electrode therebetween; depositing silicon on the source and drain regions to form a polysilicon wiring layer; and ion-implanting an impurity to an interface between the source and drain regions and the polysilicon wiring layer at acceleration voltage of 40 keV and a dose of $5 \times 10^{15}$ cm$^{-2}$ to mechanically break down an oxide film formed at said interface.

4 Claims, 16 Drawing Figures

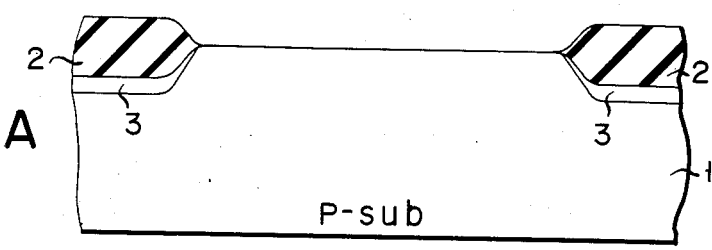
F I G. 1A
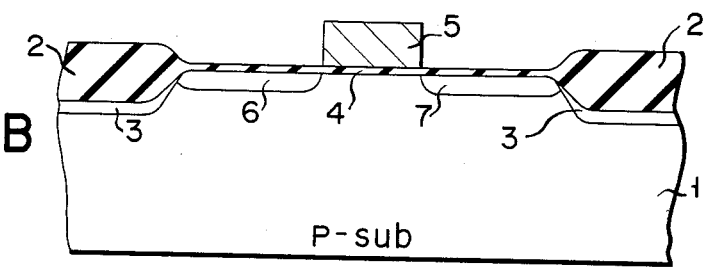
F I G. 1B
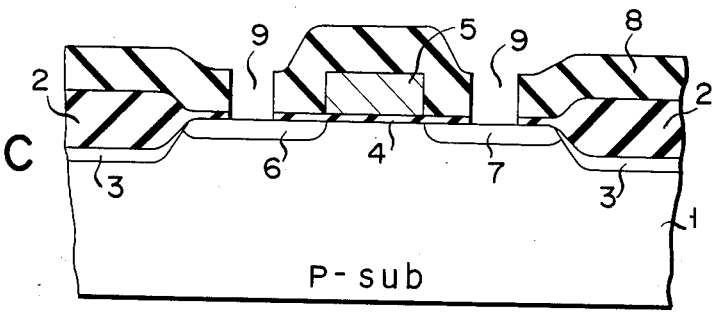
F I G. 1C
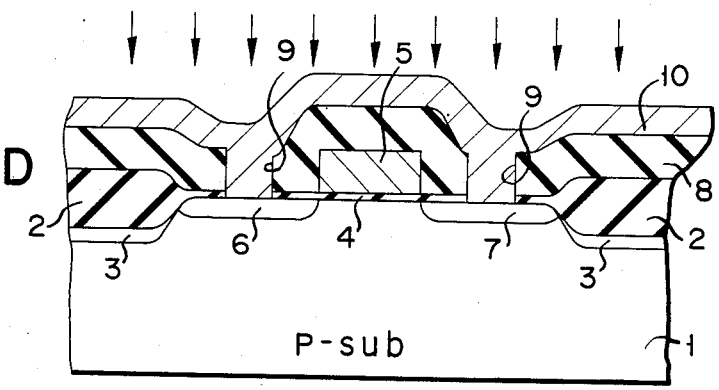
F I G. 1D

METHOD OF MANUFACTURING SEMICONDUCTOR DEVICE

BACKGROUND OF THE INVENTION

The present invention relates to a method of manufacturing a semiconductor device, which includes the step of connecting source and drain regions of an MIS semiconductor device to polysilicon wiring layers.

Multilayer wiring techniques have been recently employed to increase the packing density of semiconductor devices. Together with this, a new and improved MOS semiconductor device has been developed. This device has polysilicon wiring layers connected to its source and drain regions. A conventional MOS semiconductor device (e.g., an n-channel MOS semiconductor device) is manufactured as follows.

After a field oxide film as an element isolation region is formed in a major surface of a p-type silicon substrate to surround an island region, thermal oxidation is performed to form a gate oxide film on the island region. Subsequently, a polysilicon film as a gate electrode material is formed to cover the entire surface of the substrate and patterned to form a gate electrode. An n-type impurity, e.g., phosphorus is ion-implanted in part of the island region by using the field oxide film and the gate electrode as masks. The ion-implanted regions are activated to form $n^+$-type source and drain regions. A CVD-$SiO_2$ film as an insulating interlayer is formed on the major surface of the substrate, and contact holes are formed in the CVD-$SiO_2$ film at positions corresponding to the source and drain regions. A poly-crystalline silicon (polysilicon) film is formed to cover the entire surface of the resultant structure. Phosphorus diffusion or ion implantation is performed in the polysilicon film, and annealing is then performed at a temperature of 950° C. or higher to thermally break down a natural oxide film formed at an interface between the $n^+$-type source and drain regions and the polysilicon film, thereby establishing an ohmic contact therebetween. Thereafter, the polysilicon film is patterned to form source and drain electrodes electrically connected to the source and drain regions, respectively.

In the conventional MOS semiconductor device, the source and drain regions must be shallow to increase the packing density. For this purpose, low temperature annealing is performed to form the source and drain regions, thereby preventing the impurity from redistribution. For this reason, unlike in the conventional technique, high temperature annealing cannot be performed. As a result, the natural oxide film formed at the interface between the source and drain regions and the polysilicon film cannot be sufficiently broken down. Therefore, no ohmic contact can be established between the source and drain regions and the polysilicon wiring layer.

SUMMARY OF THE INVENTION

It is an object of the present invention to provide a method of manufacturing a highly integrated high-speed semiconductor device, wherein a good ohmic contact can be established between a polysilicon or monocrystalline silicon conductive region and a polysilicon wiring layer even if low temperature annealing for shallow source and drain regions is performed.

In order to achieve the above object of the present invention, there is provided a method of manufacturing a semiconductor device, comprising the steps of: preparing a silicon substrate having at least one conductive region; forming a polysilicon wiring layer directly on the conductive region; and mechanically breaking down a natural oxide film formed at an interface between the conductive region and the wiring layer by ion-implanting an impurity at a predetermined dose and a predetermined acceleration voltage in the interface.

The conductive region may be active regions such as source and drain regions formed by diffusion in the silicon substrate, or a silicon layer formed by deposition on the substrate. The wiring layer may comprise an electrode layer which is directly connected to the active region, or a layer connected to an electrode such as a gate electrode so as to cause a current flow between itself and the electrode.

BRIEF DESCRIPTION OF THE DRAWINGS

FIGS. 1A to 1F are respectively sectional views for explaining the steps in manufacturing a semiconductor device according to a first embodiment of the present invention;

FIGS. 2 and 3 respectively show I-V characteristics of semiconductor devices, in which FIG. 2 shows the case of the semiconductor device of the present invention, and FIG. 3 shows the conventional case;

DETAILED DESCRIPTION OF THE PREFERRED EMBODIMENTS

Figure 1E:
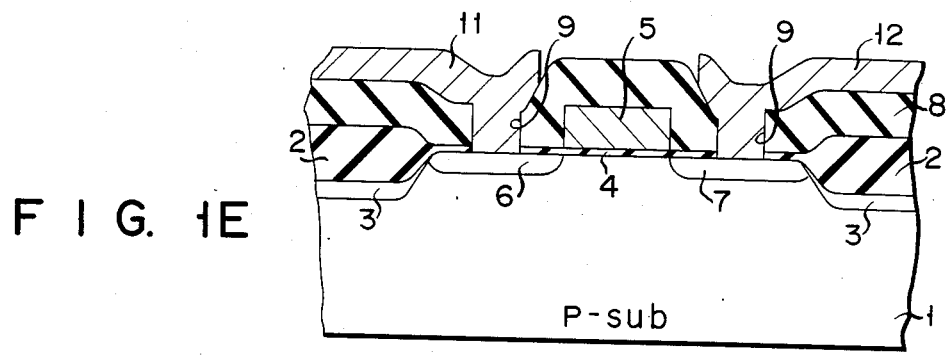

A method of manufacturing a semiconductor device according to an embodiment of the present invention will be described with reference to FIGS. 1A to 1F.

As shown in FIG. 1A, a 4,000 Å thick field oxide film 2 as an element isolation region and a $p^+$-type inversion preventive layer 3 in a substrate surface layer under the film 2 are formed by boron ion implantation and selective oxidation in a major surface of a (100) p-type silicon substrate 1 having a resistivity of 1 to 10 Ω·cm.

The resultant structure is thermally oxidized in a dry oxygen atmosphere to form a gate oxide film 4 having a thickness of 250 Å on the surface of the island region of the substrate 1 which is isolated by the film 2. A 3,500 Å thick polysilicon film is deposited to cover the entire surface (i.e., the surfaces of the films 2 and 4). Phosphorus is diffused in the polysilicon film in a $POCl_3$ atomsphere to decrease a resistivity of the polysilicon film. The phosphorus-doped polysilicon film is patterned by photoetching to form a gate electrode 5. An n-type impurity such as arsenic is ion-implanted in substrate 1 at a dose of $5 \times 10^{15}$ cm$^{-2}$ and an acceleration voltage of 40 keV by using the film 2 and the electrode 5 as masks, thereby activating the substrate to form $n^+$-type source and drain regions 6 and 7, as shown in FIG. 1B.

Subsequently, a 3,000 Å thick CVD-$SiO_2$ film 8 is deposited on the entire surface (i.e., the surfaces of the films 2 and 4 and the electrode 5). Contact holes 9 are formed in the film 8 at positions corresponding to the regions 6 and 7, as shown in FIG. 1C.

Figure 1F:
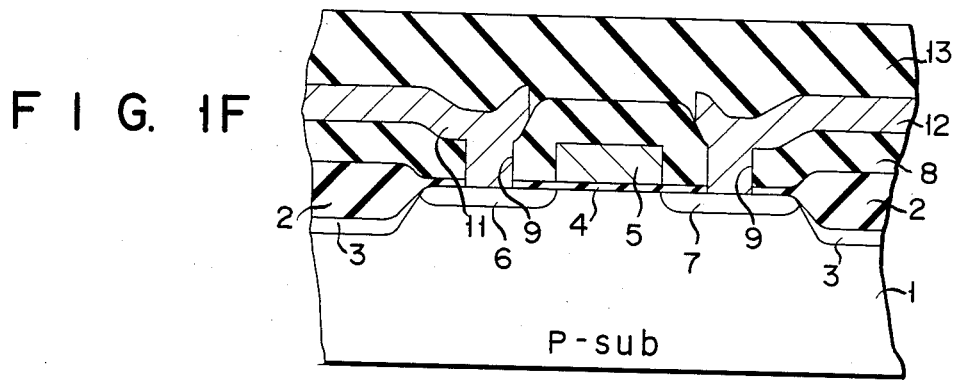

After a 2,000 Å polysilicon film 10 is deposited on the entire surface (i.e., the exposed surfaces of the film 8 and the substrate 1), phosphorus ions are implanted in the entire surface of the film 10 at a dose of $1\times10^{16}$ cm$^{-2}$ and an acceleration voltage of 160 keV, as shown in FIG. 1D. As a result, phosphorus ions having a concentration of $5\times10^{20}$ cm$^{-3}$ are doped in the interface between the regions 6, 7 in the contact holes 9 and the film 10. A natural oxide film formed at these interfaces is mechanically broken down. The film 10 is patterned by photoetching to form wiring layers 11 and 12 through the contact holes 9, as shown in FIG. 1E. Subsequently, a CVD-SiO$_2$ film 13 is deposited to cover the entire surface (i.e., the surfaces of the film 8 and the layers 11, 12, and the resultant structure is annealed at a temperature of 900° C., as shown in FIG. 1F. Contact holes (not shown) are formed in the film 13, and an Al film is deposited on the film 13. Thereafter, the Al film is patterned to form an Al wiring electrically connected to the layers 11 and 12 of the regions 6 and 7 through the contact holes of the film 13, thereby preparing an n-channel MOS semiconductor device.

In the above embodiment, after ion implantation is performed to break down the oxide film formed at the interface between the source and drain regions and the polysilicon film, the polysilicon film is patterned to form wiring. However, ion implantation may be performed after wiring is formed.

According to the method of this embodiment, after polysilicon film 10 as a wiring material is deposited on the film 8 with the contact holes 9, phosphorus is ion-implanted in the surface of the substrate 1 through at least the polysilicon film in the contact holes 9. The natural oxide film formed at the interface between the substrate 1 and the film 10 can be mechanically broken down. As a result, the film 10 is patterned to form the wiring layers 11 and 12 which are in ohmic contact with the regions 6 and 7 through the contact holes 9 without performing high temperature annealing (950° C. or higher). Therefore, a highly integrated high-speed n-channel MOS semiconductor device is prepared.

In the n-channel MOS semiconductor device manufactured by the method described above, a current $I_{DS}$ flowing across the regions 7 and 6 was measured to eliminate a channel conductance while a voltage higher than a threshold voltage was applied to the gate electrode 5 and a voltage of 0 to 10 V was applied to the region 7. Results are shown as V-I characteristics in FIG. 2. On the other hand, an n-channel MOS semiconductor device was prepared in the same manner as in this embodiment except that the step of ion-implanting phosphorus at the interface between the polysilicon film and the substrate to break down the natural oxide film was omitted. A current $I_{DS}$ flowing across the drain and source regions was measured. Results are shown as V-I characteristics in FIG. 3.

Figure 2:
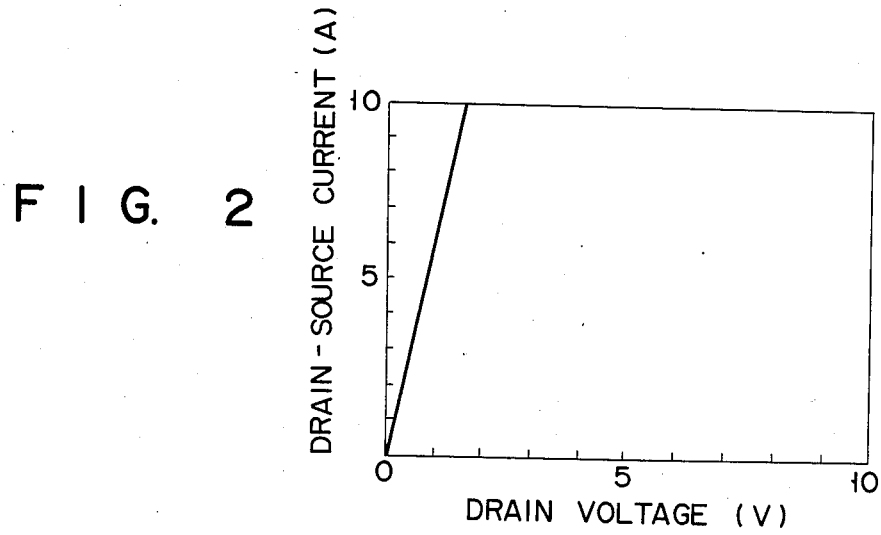
Figure 3:
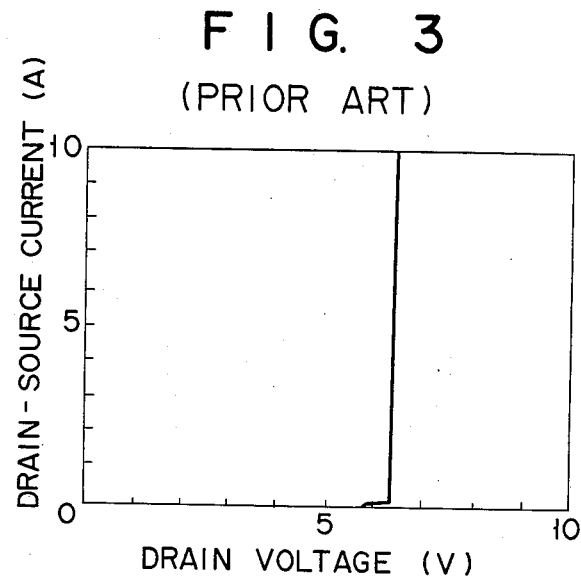

As is apparent from FIGS. 2 and 3, the current $I_{DS}$ flows even when a low drain voltage is applied to the semiconductor device manufactured in this embodiment. In addition, the current is linearly increased in accordance with an increase in voltage. Conversely, in the conventional semiconductor device, a current does not substantially flow unless an application voltage exceeds 6 V. This is because the natural oxide film is formed at the contact portion between the drain and source regions and the polysilicon wiring, and the oxide film is broken down upon application of a voltage of 6 V or more.

The above embodiment is exemplified by an n-channel MOS semiconductor device. However, the present invention can also be applied to other semiconductor devices such as p-channel MOS semiconductor devices and CMOS semiconductor devices. When a p-channel MOS semiconductor device is to be manufactured, a p-conductivity impurity such as boron must be used as an impurity ion-implanted in the substrate through the polysilicon film. In order to manufacture a CMOS semiconductor device, an impurity having the same conductivity type as in the source and drain regions must be used. Otherwise, Si or Ar must be used.

In the above embodiment, the polysilicon wiring layer is electrically connected to the source and drain regions. However, the present invention can be applied to a connection for a diffusion region having the same conductivity type as in the substrate and for applying a substrate bias.

The impurity for mechanically breaking down the oxide film is at least one of P, As, B, BF$_2$, Si and Ar. In particular, Si and Ar are preferred since these impurities do not impart conductivity to the doped layer. The dose of the impurity is preferably set at a concentration of $1\times10^{17}$ cm$^{-3}$ to $1\times10^{21}$ cm$^{-3}$ at the interface between the source and drain regions and the polysilicon film. In order to break down the natural oxide film, annealing may be performed at a temperature of 950° C. or lower.

A metal, metal silicide and/or metal nitride film may be formed on the polysilicon film to decrease a wiring resistance before the polysilicon film is patterned to form a wiring layer. For this purpose, the metal can be selected from molybdenum, tungsten, titanium, tantalum, platinum and the like. The metal silicide can be selected from molybdenum silicide, tungsten silicide, titanium silicide, tantalum silicide, platinum silicide and the like. The metal nitride can be selected from molybdenum nitride, tungsten nitride, titanium nitride, tantalum nitride and the like.

The above modification can be readily applied to second and third embodiments (to be described later). A method of manufacturing the semiconductor device according to the second embodiment of the present invention will be described with reference to FIGS. 4A to 4D.

The steps up to the step corresponding to that of FIG. 1C are the same as in FIGS. 1A to 1C and will be omitted.

Figure 4A:
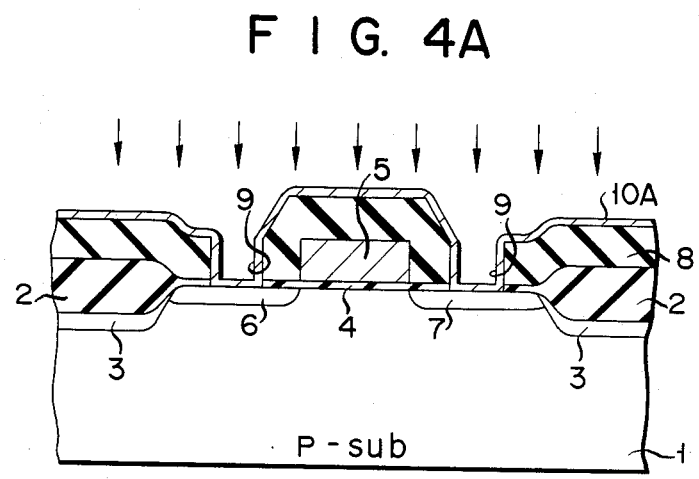
FIGS. 4A to 4D are respectively sectional views for explaining the steps in manufacturing a semiconductor device according to a second embodiment of the present invention.
Figure 4B:
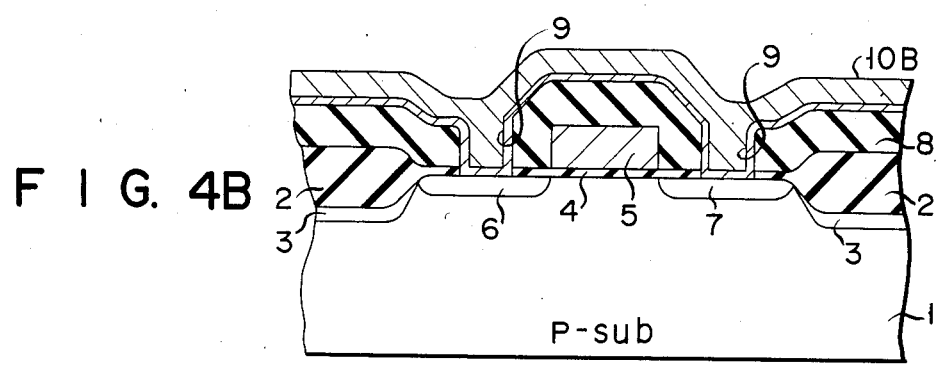

After a thin first polysilicon film 10a of a thickness of 400 Å is deposited to cover the entire surface (i.e., exposed surfaces of a CVD-SiO$_2$ film 8 and a silicon substrate 1), phosphorus is ion-implanted in the entire surface of the polysilicon film 10a at a dose of $1\times10^{15}$ cm$^{-2}$ and an acceleration voltage of 40 keV, as shown in FIG. 4A. As a result, phosphorus having a concentration of $5\times10^{20}$ cm$^{-3}$ is doped in the interface between source and drain regions 6 and 7 in contact holes 9 and the polysilicon film 10a, so that a natural oxide film formed at the interface can be mechanically broken down. A thick second polysilicon film 10b of a thickness of 1,600 Å is deposited to cover the entire surface of the film 10a. As shown in FIG. 4B, ion-implanted at a does of $1\times10^{15}$ cm$^{-2}$ and an acceleration voltage of 40 keV.

Figure 4C:
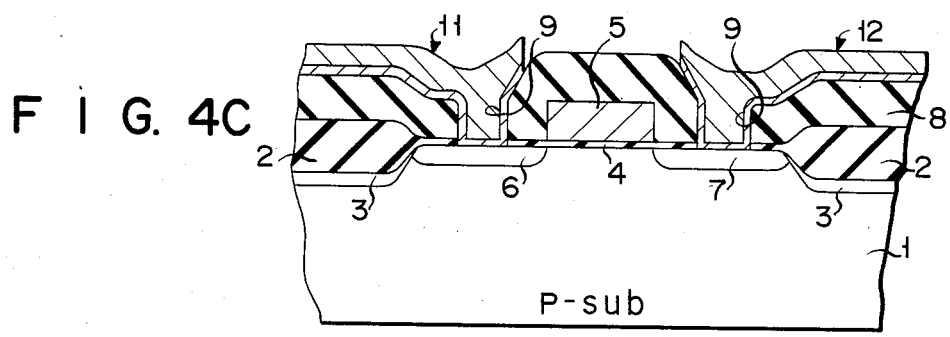

The films 10a and 10b are patterned by photoetching, and wiring layers 11 and 12 are formed to contact the regions 6 and 7 through the contact holes 9, as shown in FIG. 4C.

Figure 4D:
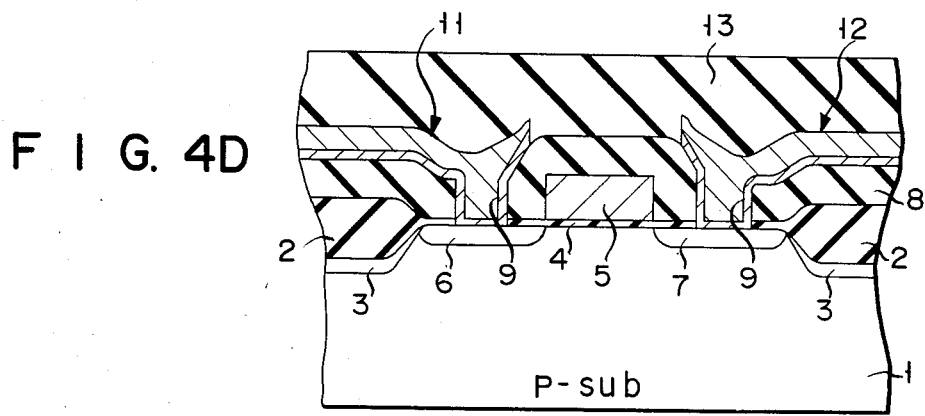

A CVD-SiO$_2$ film 13 is deposited on the entire surface (i.e., the surfaces of the film 8 and the layers 11 and 12), and the resultant structure is annealed at a temperature of 900° C., as shown in FIG. 4D. Contact holes (not shown) are formed by a known technique in the film 13, and an Al is deposited on the film 13. Thereafter, the Al film is patterned to form Al wirings contacting the layers 11 and 12 of the regions 6 and 7 through the contact holes of the film 13, thereby preparing an n-channel MOS semiconductor device.

According to the method of the second embodiment, after the film 10a is deposited on the film 8 with the contact holes 9, phosphorus is ion-implanted in the substrate 1 through at least the polysilicon film portions in the contact holes 9, and the natural oxide film formed at the interface between the substrate 1 and the film 10a can be mechanically broken down. As a result, after the film 10b is deposited to obtain a desired thickness for the wiring layer, the wiring layer is patterned to obtain the same effect as in the first embodiment.

In the second embodiment, after the oxide film formed at the interface between the source and drain regions and the first polysilicon film is broken down by ion implantation, the first and second silicon films are patterned to form the wiring. However, further ion implantation may follow the wiring formation. Ion implantation and patterning may be performed after the second polysilicon film is formed.

In the above embodiment, the thickness of the first polysilicon film is preferably 100 to 1,000 Å. When the first polysilicon film has a thickness less than 100 Å, good ohmic contact cannot be established between the source and drain regions and the first polysilicon film. However, when the thickness exceeds 1,000 Å, an expensive ion implanter for implanting impurity ions at a high acceleration voltage is required. In addition, when an impurity comprises phosphorus or boron which imparts conductivity to the doped layer, the impurity concentration profile extends to a shallow junction of each of the source and drain regions. In this case, the junction depth of each of the source and drain regions becomes larger than the prescribed depth, thereby preventing micropatterning. When an impurity such as Ar which does not impart conductivity to the doped layer is used, a leakage current flows through the junction since defects are formed in the junctions of the source and drain regions. A thickness of the second polysilicon film is determined such that the total thickness of the first and second polysilicon films exceeds 2,000 Å.

In the first and second embodiments, break down of the oxide film naturally formed between the source and drain regions formed in the monocrystalline silicon substrate and the polysilicon electrodes, that is, between monocrystalline silicon and polysilicon is a main aim. However, the present invention is not limited to such a breakdown. For example, the present invention may aim at mechanically breaking an oxide film formed between polysilicon films.

The breakdown of the oxide film between two polysilicon films will be described with reference to FIGS. 5A to 5D.

Figure 5A:
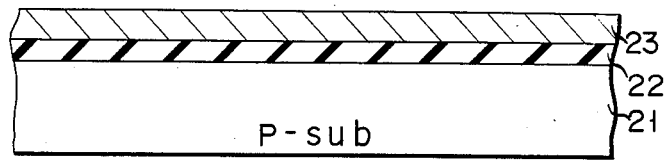
FIGS. 5A to 5D are respectively sectional views for explaining the steps in manufacturing a semiconductor device according to a third embodiment of the present invention.

A 4,000 Å thick field oxide film 22 as a first insulating film and a p-type inversion preventive layer (not shown) are formed by boron ion implantation and selective oxidation on a major surface of a p-type silicon substrate 21. The resultant structure is thermally oxidized to form a gate oxide film (not shown) on the surface of the island region (element region) isolated by the film 22. Thereafter, a first polysilicon film having a thickness of 3,000 to 4,000 Å is deposited to cover the entire surface and is patterned to form a gate electrode 23 as a first polysilicon wiring pattern. An n-type impurity such as is ionimplanted at a dose of $5 \times 10^{15}$ cm$^{-2}$ and an acceleration voltage of 40 keV by using the electrode 23 and the film 22 as masks, thereby activating doped regions to form n+-type source and drain regions (not shown), as shown in FIG. 5A.

Figure 5B:
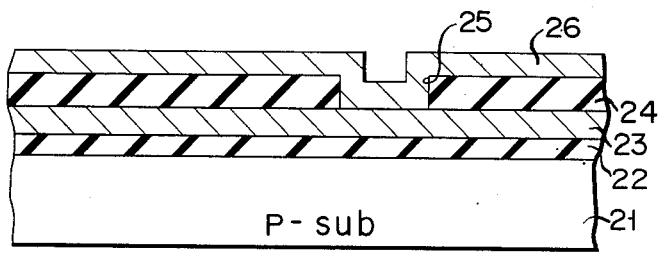

A CVD-SiO$_2$ film 24 as a second insulating film is deposited and selectively etched to form contact holes 25 in the film 24. A second polysilicon film 26 having a thickness of 2,000 Å is then deposited to cover the entire surface, as shown in FIG. 5B.

Figure 5C:
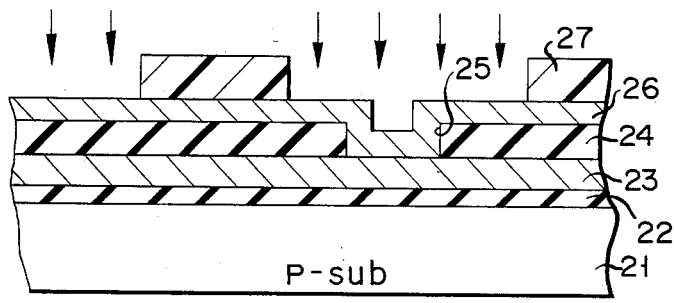

After a resist pattern 27 is formed on the film 26, phosphorus is ion-implanted at a dose of $1 \times 10^{16}$ cm$^{-2}$. and an acceleration voltage of 160 keV by using the pattern 27 as a mask, as shown in FIG. 5C.

As a result, phosphorus having a concentration of $5 \times 10^{20}$ cm$^{-3}$ is doped in the interface between the wiring layers 23 and 26 in the contact holes 25, and a naturally formed oxide film at the interface is mechanically broken.

Figure 5D:
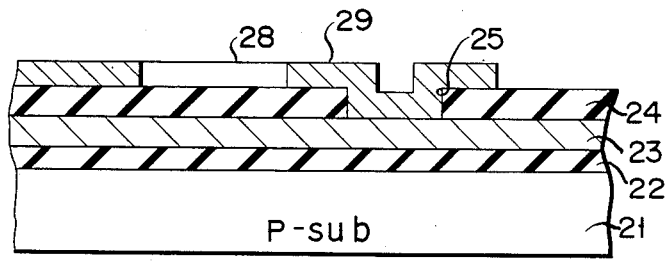

The pattern 27 is removed, and the second polysilicon film is patterned. The resultant structure is annealed at a temperature of 900° C. to form a polysilicon gate wiring layer 29 which is electrically connected to the electrode 23 through the contact hole and which has a high resistance layer 28. As shown in FIG. 5D, an n-channel MOS transistor is prepared.

According to the method of the present invention, after the film 26 is deposited on the film 24 with the contact holes 25, phosphorus is ion-implanted in the surface of the electrode 23 through at least the polysilicon film 26 portions in the contact holes 25, so that a natural oxide film formed at the interface between the electrode 23 and the film 26 can be mechanically broken down. By patterning the film 26, the layer 29 can be in good ohmic contact with the electrode 23 through the contact hole 25 without performing high temperature annealing (950° C. or higher). Therefore, a highly integrated high-speed n-channel MOS transistor can be prepared.

Said second polysilicon may be performed by two depositing steps, like the second embodiment. Also, after the patterning of the second polysilicon, an ion implantation may be made.

When the V-I characteristics of the semiconductor devices of the second and third embodiments were measured, the same effect as in the first embodiment was obtained.

What is claimed is:

1. A method of manufacturing a semiconductor device, comprising the steps of:
    forming a first polysilicon wiring layer on a major surface of a semiconductor substrate;
    forming an insulating layer on the first polysilicon wiring layer;
    forming through-holes in the insulating layer to expose parts of the first polysilicon wiring layer;
    forming a polysilicon film of a high resistance on the exposed parts of the first polysilicon wiring layer and the insulating layer;
    forming a pattern on the part of the polysilicon film on the insulating layer;
    ion-implanting an impurity at an interface between the first polysilicon wiring layer and polysilicon film through the polysilicon film masked with the pattern, whereby an oxide film formed at said interface is mechanically broken down and the polysilicon film is divided into a conductive portion which is implanted with the impurity and a non-conductive portion which is masked with the pattern; and removing the pattern from the polysilicon film.

2. The method according to claim 1, wherein said first polysilicon wiring-layer-forming step includes a step of patterning the first polysilicon wiring layer to form a gate electrode, and a step of ion-implanting an impurity into the substrate, using the gate electrode as a mask, to form source and drain regions.

3. The method according to claim 2, wherein said both ion-implantations employ impurities of the same conductivity type.

4. A method of manufacturing a semiconductor device, comprising the steps of:
preparing a silicon or polysilicon layer of one conductivity type;
forming a polysilicon film of high resistance; and
ion-implanting an impurity of the same conductivity type as that of the silicon or polysilicon layer into an interface between the layer and polysilicon film through part of the polysilicon film.

* * * * *